United States Patent [19]

Kolkman

[11] Patent Number: 4,645,148
[45] Date of Patent: Feb. 24, 1987

[54] FAIL-SAFE VOLTAGE-LIMITING CIRCUIT FOR AN AUDIO FREQUENCY OVERLAY TRACK CIRCUIT

[75] Inventor: Dick J. Kolkman, Gibsonia, Pa.

[73] Assignee: American Standard Inc., Swissvale, Pa.

[21] Appl. No.: 735,017

[22] Filed: May 16, 1985

[51] Int. Cl.[4] .............................................. B61L 25/02
[52] U.S. Cl. ................................. 246/34 A; 246/122 R
[58] Field of Search ................. 246/28 F, 34 A, 34 B, 246/34 C, 34 R, 122 R, 63 R, 63 A; 340/48; 329/110

[56] References Cited

U.S. PATENT DOCUMENTS

| | | | |
|---|---|---|---|
| 3,345,512 | 10/1967 | Failor | 246/122 R |
| 3,715,669 | 2/1973 | LaForest | 246/34 B |
| 4,109,205 | 8/1978 | Moorey | 246/30 |
| 4,179,744 | 12/1979 | Lowe | 246/122 R |
| 4,320,880 | 3/1982 | Sibley | 246/34 R |
| 4,560,943 | 12/1985 | Negus et al. | 329/110 |

Primary Examiner—John W. Caldwell, Jr.
Assistant Examiner—David A. Okonsky
Attorney, Agent, or Firm—G. E. Hawranko

[57] ABSTRACT

A fail-safe voltage-limiting circuit for an audio frequency-controlled railway track circuit includes a pair of NPN transistors arranged in the manner of a darlington pair, wherein the base connector of the first transistor receives an amplitude-modulated signal from a filter and detector circuit connected to the rails. A first pair of resistors arranged in series between the positive and negative system battery lines, includes a first fail-safe resistors also connected to the collector of the first transistor. The ratio of the first and second resistors are selected to limit the positive excursion of the input signal, thus clipping excess noise at this limit. A second pair of resistors is coupled to the second transistor to limit the negative excursion of the amplitude-modulated input signal. The second pair of resistors includes a second fail-safe resistor connected to the emitter of the second transistor and a third resistor connected in series to the second fail-safe resistor at this junction as well. An amplitude-limited sinusoidal signal is taken from the emitter of the second transistor and fed to a demodulator and driver circuit to operate a fail-safe relay as a function of the presence or absence of the amplitude-modulated portion of the input signal.

16 Claims, 3 Drawing Figures

FAIL-SAFE VOLTAGE-LIMITING CIRCUIT FOR AN AUDIO FREQUENCY OVERLAY TRACK CIRCUIT

BACKGROUND OF THE INVENTION

This invention relates to a fail-safe voltage-limiting circuit for an audio frequency overlay track circuit, which type of track circuit has found particular acceptance in the highway-crossing area and certain mass transit installations of the railroad signaling field.

Such overlay track circuits typically employ an AM or amplitude-modulated signal superimposed over the existing track circuits for the longer track sections and transmitted over the rails such that; in the presence of a train, the AM signal is shorted out by the shunting effect of the train wheels, and the absence or drop-out of the AM signal is therefore used to operate the track circuit relay. It has been found, in using the rails for communicating the AM signal between the ends of the track sections, that electrical noise can occur of sufficient magnitude such that the signal receiver operates as if the overlay signal is present which can be especially dangerous when, in the presence of a train, such noise can result in falsely indicating an unoccupied track section. Such noise can arise from various sources; for instance, in territory electrified for train propulsion, insulated joints, and impedance bonds are used to bridge the propulsion current across the offset rail joints resulting in an imbalance of the return-current which, in turn, causes EMI spikes on the order of 60 to 90 volts. Still more electrical noise is introduced to the rails by the propulsion energy itself which can typically be on the order of 10 kilovolts, 25 hertz source and which, due to the stopping and starting of a chopper-controlled vehicle, can result in electrical spikes of sufficient magnitude to be detectable by the receiver.

Additionally, in the railroad signaling industry where circuit components can have operating voltage levels ranging between 9.5 and 16 volts, it is advantageous that a fail-safe voltage-limiting circuit operate effectively within this range, as well, using a fixed arrangement of components, thereby facilitating maintenance and device-interchangeability.

Inherent in the design of circuits relating to railroad track circuits, is the need to provide fail-safe protection such that, failure of any component within the circuit results in an output corresponding to the most-restricted condition.

SUMMARY OF THE INVENTION

It is, therefore, an object of the invention to provide a fail-safe voltage-limiting circuit for an audio frequency overlay-type track circuit that limits the value of the output signal to a predetermined range of voltages, regardless of the level of the input signal.

It is a further object of the invention to provide such a fail-safe voltage-limiting circuit which provides a predictable output signal regardless of the particular rail conditions to which the track circuit is being applied.

It is yet a further object of the invention to provide such a fail-safe voltage-limiting circuit which uses as the reference signal, the battery lines instead of the rails, thereby substantially eliminating an added source of electrical noise and, simultaneously, making the value of the output signal a function of the battery voltage regardless of the preselected battery voltage used.

It is still a further object of the invention to provide such a fail-safe voltage-limiting circuit which eliminates the need to adjust or modify the circuit upon selection of an alternate system operating voltage level, the upper and lower voltage limits of the output signal being approximately the same proportionate peak-to-peak voltage relative to the system operating voltage.

It is an even further object of the invention to provide such a fail-safe voltage-limiting circuit which assumes the output to effect the most restrictive condition in the event of a short-circuit or open-circuit condition of any of the components of the voltage-limiting circuit.

Briefly, the invention consists of a pair of NPN transistors connected in the manner of a Darlington pair. Input to the base collector of a first transistor is a filtered, detected AM signal imposed onto the rails by an audio frequency overlay transmitter. A first resistor and a second resistor, which is a fail-safe type 4-terminal resistor, are connected in series between the positive and negative battery lines. A connection branching off from between the first and second resistors connects to the collector terminal of the first transistor. Coupled to the positive battery line is the collector terminal of the second transistor. A third resistor, which is also a fail-safe-type 4-terminal resistor, is connected in series with a fourth resistor and is connected at an emitter terminal of the second transistor at the junction of the third and fourth resistors. A smoothing capacitor is connected across the second resistor to filter DC ripple that may be present. The output of the fail-safe voltage-limiting circuit is taken from the emitter terminal of the second transistor and fed through a demodulator/relay driving circuit which then can connect to the track circuit relay for operation of the relay according to the detection of the presence or absence of the AM signal free from electrical noise or interfering voltage spikes. By connecting the first and second resistors and the third and fourth resistors in the described manner, it can be determined that the limit on a positive excursion of the output signal is a function of the ratio of resistor values R1 and R2, and the limit on the negative excursion of the output signal is a function of the ratio of resistor values R3 and R4.

DESCRIPTION AND OPERATION

Figure 1:
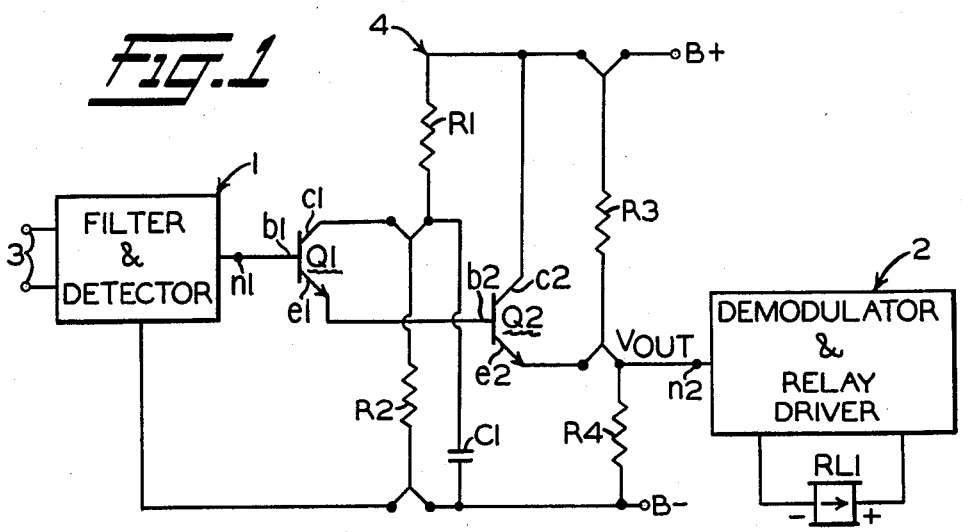
FIG. 1 is a schematic diagram of a fail-safe voltage-limiting circuit constructed in accordance with the invention.

As seen in FIG. 1, a fail-safe voltage-limiting circuit 4 for an audio frequency overlay-type railway track circuit includes a filter and detector circuit 1 which has a 2-terminal input connection 3 connected across the rails (not shown) for receiving the audio frequency signal. Use of such overlay-type track circuits has been particularly beneficial where a short track section within an existing longer track section must be controlled. In addition to the obvious advantage this arrangement has to the approach areas of a highway-crossing installation, such an arrangement can also be used successfully in mass transit applications where shorter approach track sections are found between transit stations. In such applications, response time and the integrity of the track occupancy detecting equipment is critical due to these shorter distances and the faster vehicle speeds. Mass transit-type operations, as well, impose significant design challenges in overcoming electrical noise and interference problems typically encountered when tracks are electrified for train propulsion and such propulsion energy in vehicle operation has large EMI, harmonics, and voltage spikes associated therewith due especially to the stopping and starting operations of the chopper-controlled vehicles.

In track areas using insulated joints to bridge rail sections and impedance bonds for propulsion energy transmission through the rails, the insulated joints have to be offset so that the vehicle wheels do not stress the rails and surface on which the rails are installed. Such offset insulated joint arrangement has the effect of creating a coupling imbalance for the return-current, which imbalance thus can cause an impulse on the rails in a range of 60 to 90 volt spikes and higher.

Figure 2A:
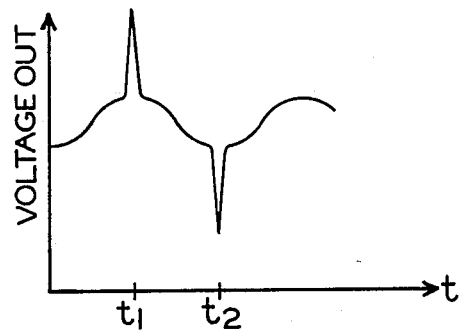
FIG. 2A is a graphical representation of the detected amplitude-modulated, sinusoidal output signal versus time without a voltage-limiting arrangement.
Figure 2B:
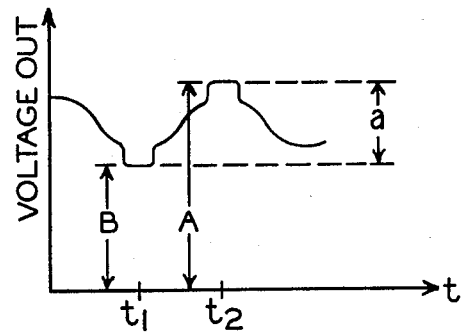
FIG. 2B is a graphical representation of the detected limited amplitude-modulated, sinusoidal output signal versus time.

As further seen in FIG. 1, the fail-safe voltage-limiting circuit 4 outputs a signal graphically represented in FIG. 2B, to a demodulator and relay driver circuit 2 which converts the output voltage signal to a DC voltage to drive the fail-safe relay RL1 in a manner generally known in the railroad signaling art. In such an established field of art as railroad signaling, certain optimum operating ranges have been determined to insure fail-safeness and so that installation, maintenance, and component-interchangeability can be accomplished with relative ease and at a low cost. To this end, it has been determined that for maximum sensitivity to the shunting effect of the train, a small signal portion of the output signal should be on the order of 0.3 volts, peak-to-peak and that under normal operating conditions will be in the range of 1.5 volts peak-to-peak as represented in FIG. 2B by the reference (a). It should be appreciated that though the above-discussed peak-to-peak values are to be strictly adhered to for this particular railroad signaling application, this fail-safe voltage-limiting circuit 4 can accommodate alternate voltage levels as will be discussed hereinafter in further detail.

This AM signal, imposed on the rails (not shown) at one end of the track section by an audio frequency overlay transmitter (not shown), is communicated to a filter and detector circuit 1 over a pair of input terminal connectors 3, as shown in FIG. 1. The filter and detector circuit 1 performs the operations of passing only the selected frequency AM signal associated with the designated track section and of demodulating the carrier portion of the signal by means of an envelope detector such that, the signal presented to the base terminal b1 of the first transistor Q1 is essentially the AM signal with possibly an EMI or noise portion. Transistor Q1, as shown in FIG. 1, is an NPN transistor and, as such, current flows when the input signal is present at the base terminal b1, from the collector terminal c1 of the first transistor Q1, to the emitter terminal e1. The emitter terminal e1 of the first transistor is directly connected to the base terminal b2 of the second transistor, which is also an NPN transistor, thus forming a Darlington connection between the first and second transistors Q1 and Q2.

Connected to the collector terminal c1 of the first transistor Q1 is one terminal of a first resistor R1 which, at the opposite end, is connected to the positive battery line. In series-connection with the first resistor R1 is a second resistor R2, which connection extends from the collector terminal c1 with a first transistor Q1, to the negative battery line. The second resistor R2 is a 4-terminal type resistor, as disclosed in U.S. Pat. No. 4,101,820, and which is incorporated herein by reference. The 4-terminal resistor is a fail-safe resistor constructed such that, in the event of a circuit interruption such as, for example, any rupture of the resistive material or support block due to thermal differences or mechanical force, the continuity of one or both connector strips is interrupted to create a safe-failure condition. It can be appreciated that the first resistor R1 is connected to the collector terminal c1 of the first transistor Q1 through the 4-terminal second resistor R2 thereby insuring that a failure of R1, as well, results in an interruption of current flowing through the transistor Q1. The fail-safe feature of the second resistor R2 also insures that a ground connection to the fail-safe voltage-limiting circuit 4 is interrupted upon failure of the resistor. Connected across the second resistor R2; that is, from the junction between the first and second resistors R1 and R2 to the return line, is a smoothing capacitor C1 which is of sufficient reactance to smooth any DC ripple that may be present on the AM signal.

Also connected from the positive battery line is a third resistor R3 which is a fail-safe 4-terminal resistor, similar to the second resistor R2. At the opposite lead of the third resistor R3, an output line extends to the demodulator and relay driver circuit 2 through a second node n2, and by way of the equivalent resistor terminal, connects to the emitter terminal e2 of the second transistor Q2. The fail-safe feature of this resistor R3 prevents an output from the second transistor in the event of a rupture of the material composing the resistor R3 and, additionally, interrupts the positive battery connection to the second transistor Q2 by opening the connection to the collector terminal c2 of the second transistor Q2 to the positive battery line.

A fourth resistor R4 also connects from the emitter terminal e2 of transistor Q2 at one end such that, a series connection is formed between the third and fourth resistors R3 and R4. The fourth resistor R4 connects on the opposite lead to the negative battery line. In the illustrated connection, the third and fourth resistors exhibit a voltage-limiting effect with respect to the negative-going portion of the output voltage, such output voltage being a function of the battery voltage and the ratio of resistors R3 and R4. As seen in FIG. 2A, a negative-going spike occurring on an input voltage, is translated to an output voltage as shown at time t2, which input voltage is not translated to the output voltage also shown at t2 in FIG. 2B due to the fail-safe voltage-limiting circuit 4.

Similar to the voltage-limiting effect of resistors R3 and R4 on the negative-going portion of the output signal, the first and second resistors R1 and R2, arranged in the manner of a voltage-dividing circuit, limit the positive-going excursion of the output signal. Such limiting effect can be seen in FIG. 2B, whereby a positive-going spike is not translated into the output signal that is limited, as well, by the ratio of the first and second resistors R1 and R2.

The ratios of the first and second resistors R1 and R2 and the third and fourth resistors R3 and R4 can be independently chosen such that, the upper limit of the output signal is the same value as the lower limit, thereby resulting in a symmetric sinusoidal signal. Such resistor ratios can also be selected such that a nonsymmetrical output signal is achieved; that is, either the upper or the lower limit on the output voltage is of a greater magnitude than the other voltage limit.

The demodulator and relay driver circuit 2 (shown in FIG. 1) receives the limited output signal (shown in FIG. 2B) and creates a DC signal therefrom such that, the fail-safe track relay RL1 is energized thereby. In railroad operations, the fail-safe feature of the relay RL1 is such that, the relay is energized thereby picking the associated relay contacts when the AFO or audio frequency overlay signal is imposed onto the rails, and the relay drops out, or is deenergized, upon failure of any component associated with the operations and control of the fail-safe relay RL1 or the AFO signal; thus assuming the worst-case condition, namely, a track-occupied condition.

In operation, an audio frequency overlay signal is imposed on the rails by an AF transmitter (not shown) at one end of the track section to be indicated. Assuming that no train is present to shunt the signal over the rails, this audio frequency overlay signal is received at the other end of the track section over the pair of input terminals 3 and then fed to the filter and detector circuit 1. The filter and detector circuit 1 includes a 4-pole Butterworth band pass filter portion which passes only the selected frequency signal to a detector portion for demodulation. The resulting carrier demodulated signal presented at the output terminal, designated as node n1 in FIG. 1, of the filter and detector circuit 1 is a sinusoidal wave of varying amplitude having a noise component associated therewith.

As the input AM signal varies, the small signal time-varying voltage causes a time-varying base current to flow into the base terminal b1 of the first transistor Q1 as a function of the input impedance of the first transistor Q1. During the positive excursion of this time-varying base current, a proportionate positive excursion of the collector current through transistor Q1 is generated. This time-varying collector current flows from the positive battery line through the first resistor R1 and then from the collector terminal c1 of the first transistor Q1 through the emitter terminal e1 of the first transistor Q1. As this collector current through the first transistor Q1 now becomes the base current to the second transistor Q2, by way of the base terminal b2 of the second transistor Q2 being connected to the emitter terminal e1 of the first transistor Q1 in the manner of a Darlington arrangement, the collector current through transistor Q2 increases, as well, during the positive excursion of the input signal. Additionally, in connection with first and second resistors R1 and R2 in series between the positive and negative battery lines, it can be observed that any increase in voltage-drop across one, due to increased current flow therethrough, must be counterbalanced by a decrease in voltage-drop across the other. Furthermore, in connecting the first stage of the darlington pair, that is, the first transistor Q1 from the junction point between the first and second resistors R1 and R2; the increase or decrease in voltage-drop across the first and second resistors R1 and R2 is limited by the ratio of resistance values of first and second resistors R1 and R2. The output voltage, as taken from the collector terminal c1 of the first transistor Q1, determines the upper voltage limit according to the first equation:

$$\text{upper limit} = \frac{R2}{R1 + R2} V_{battery} \quad \text{(I)}$$

The ratio of resistance values for the first and second resistors R1 and R2 can be selected to provide, in the case of an AM signal used to control a DC railway track circuit relay, a small signal upper limit of approximately 0.75 volts on a signal having a DC component of approximately 6 volts as shown by reference A of FIG. 2B; such upper limit being achieved, by one example, using the resistance values of 14 kohms for R1 and 22 Kohms for R2. Furthermore, if a different value battery voltage is used for operating this particular railroad installation, the same resistive ratio will result in approximately a proportionate allowable peak-to-peak output voltage swing, thereby eliminating the need to modify the fail-safe voltage-limiting circuit for any particular installation.

During the negative excursion of the input signal, the small signal base current which activates the first transistor Q1 is decreasing, thereby decreasing the small signal collector current flowing through transistor Q1 to the base terminal b2 of transistor Q2. Similar to the limiting effect of the ratio of resistive values of the first and second resistors R1 and R2, the same is true for the resistive values of the third and fourth resistors R3 and R4. It can be seen by the second equation:

$$\text{lower limit} = \frac{R4}{R3 + R4} V_{battery} \quad \text{(II)}$$

that the voltage-drop across the collector-to-emitter junction of transistor Q2 acts together with the battery voltage and the second resistive ratio to determine the lower voltage limit. Since, during the negative excursion of the input signal, the value of the small signal current portion of the collector current flowing through the second transistor Q2 is decreasing, while the voltage-drop across the collector-to-emitter junction of the second transistor Q2 is increasing, a lower limit is reached as a function of the ratio of the resistive values of the third and fourth resistors R3 and R4.

This second resistive value ratio can be selected, similar to the first ratio, to provide a lower limit of approximately $-0.75$ volts on a signal having a DC component of approximately 6 volts as shown by the reference B in FIG. 2B. This lower voltage limit, symmetric to the first higher voltage limit, can be achieved; in one example, by resistive values of 2.7 Kohms for resistor R3 and 2 Kohms for resistor R4. The impedance of the fail-safe voltage-limiting circuit 4, measured at the output terminal designated as node n2 in FIG. 1, must be substantially lower than the input impedance of the demodulator and relay driver circuit 2 in order to minimize loading effects.

In the event a train enters the track section in which the audio frequency overlay-type track circuit is being utilized, the audio frequency signal will be shunted and there will be no small signal presented to the base connector b1 of the first transistor Q1. Under these conditions, the signal present at the output terminal of the fail-safe limiting circuit 4 will consist entirely of the DC voltage-drop measurable at node n2; which voltage-drop, presented to the demodulator and relay driver circuit 2, results in a deenergization of the fail-safe relay RL1.

Of particular advantage in using the fail-safe voltage-limiting circuit 4 in an audio frequency overlay-type railway track circuit is during track-occupied conditions and the presence of EMI that could saturate the input filter making the filter behave in a nonlinear fashion; in such event, the EMI could act like a viable AFO signal to the demodulator and relay driver circuit 2 and eventually energizes the track relay RL1, such energization falsely indicating an unoccupied track. Additionally, by limiting the range of detectable voltage signals to the demodulator and relay driver circuit 2 by the fail-safe voltage-limiting circuit 4, to approximately one tenth of the system operating voltage, it has been determined that the probability of passing EMI as a viable AF signal is reduced by a commensurate amount; that is, it is approximately ten times more difficult for EMI to fall within the detectable signal range.

In the event of failure of any of the resistors used in the fail-safe voltage-limiting circuit, use of the fail-safe 4-terminal resistors for the second and third resistors R2 and R3 prevent the flow of current through the respective collector terminals c1 and c2 of the first and second transistors Q1 and Q2.

Though the above discussion has presented a fail-safe voltage-limiting circuit for an audio frequency overlay-type railway track circuit, using a unique arrangement of resistors and fail-safe 4-terminal resistors to bias a pair of PNP transistors connected in a Darlington arrangement, other alternatives for practicing the invention are contemplated herein as well. For example, PNP transistors can be used in place of the designated NPN transistors. Additionally, the resistive ratios selected for limiting the positive and negative excursions of the output signal can be selected such that, the upper and lower limits are not symmetrical but, in fact, asymmetrical about the DC component value; and further, that the limit values can be alternatively established. Still another alternative could be to insert potentiometers in series to the designated resistors such that adjustments could be readily achieved.

Having thus described the invention, what I claim as new and desire to secure by Letters Patent, is:

1. A fail-safe voltage-limiting circuit for an audio frequency-controlled railway track circuit arrangement having a filter, demodulator circuit at a receiving track circuit end, said fail-safe voltage-limiting circuit comprising:
   (a) indicating means operable over a preselected battery voltage level for indicating an occupied condition as a function of an amplitude portion of an input signal;
   (b) a first transistor having a base terminal coupled to the filter, demodulator circuit;
   (c) first limiting means coupled to a first collector terminal of said first transistor for limiting such input signal to a predetermined first limit value during an increasing amplitude excursion of such amplitude portion as a function of a predetermined first resistive ratio associated with said first limiting means, such predetermined first resistive ratio being derived in part by a first fail-safe resistor connected to said first collector terminal such that, a ground portion of such preselected battery voltage level is interrupted to said first transistor upon failure of said first limiting means;
   (d) a second transistor having a second base terminal connected to a first emitter terminal of said first transistor; and
   (e) a second fail-safe resistor connected between a second emitter terminal of said second transistor and said indicating means such that, a failure of said second fail-safe resistor interrupts a positive portion of such preselected battery voltage level to said second transistor and prevents coupling of such amplitude-limited input signal to said indicating means.

2. A fail-safe voltage-limiting circuit, as set forth in claim 1, further comprising a second limiting means coupled to said second transistor for limiting such input signal to a predetermined second limit value during a decreasing excursion of such amplitude portion as a function of a predetermined second resistive ratio.

3. A fail-safe voltage-limiting circuit, as set forth in claim 1, wherein such predetermined first resistive ratio is determined as a function of said first fail-safe resistor being in series connection with a second resistor between battery lines associated with such preselected battery voltage level and coupled to said first collector terminal at a junction between said first fail-safe resistor and said second resistor, said first fail-safe resistor having first and second pairs of equivalent terminals arranged such that, said second resistor connects to one of said first pair of equivalent terminals and said first collector terminal connects to the other of said first pair of equivalent terminals.

4. A fail-safe voltage-limiting circuit, as set forth in claim 2, wherein such second predetermined resistive ratio is determined as a function of said second fail-safe resistor being in series connection with a fourth resistor between battery lines associated with such preselected battery voltage level and coupled to said second emitter terminal at a second junction between said second fail-safe resistor and said fourth resistor, said second fail-safe resistor having third and fourth pairs of equivalent terminals arranged such that, said fourth resistor connects to one of said third pair of equivalent terminals and said second emitter terminal connects to the other of said third pair of equivalent terminals.

5. A fail-safe voltage-limiting circuit, as set forth in claim 1, further comprising a capacitor connected across said first fail-safe resistor such that a direct current component of such input signal is filtered thereby.

6. A fail-safe voltage-limiting circuit, as set forth in claim 3, further comprising a second limiting means coupled to said second transistor for limiting such input signal to a predetermined second limit value during a decreasing excursion of such amplitude portion as a function of a predetermined second resistive ratio, such second predetermined resistive ratio is determined as a function of said second fail-safe resistor being in series connection with a fourth resistor between battery lines associated with such preselected battery voltage level and coupled to said second emitter terminal at a second junction between said second fail-safe resistor and said fourth resistor, said second fail-safe resistor having third and fourth pairs of equivalent terminals arranged such that, said fourth resistor connects to one of said third pair of equivalent terminals and said second emitter terminal connects to the other of said third pair of equivalent terminals.

7. A fail-safe voltage-limiting circuit, as set forth in claim 6, wherein such predetermined first limit value is a product of such preselected battery voltage level and such predetermined first resistive ratio and is independent of the amplitude of such input signal as presented to said first base terminal of said first transistor.

8. A fail-safe voltage-limiting circuit, as set forth in claim 7, wherein said predetermined first resistive ratio is essentially the resistive value of said second resistor divided by the sum of the resistive values of said first fail-safe resistor and said second resistor.

9. A fail-safe voltage-limiting circuit, as set forth in claim 7, wherein such predetermined second limit value is essentially a product of the difference between such preselected battery voltage level and a voltage-drop across a collector-to-emitter junction of said second transistor and such predetermined second resistive ratio, such predetermined second limit value being independent of such amplitude portion of such input signal as presented to said first base terminal of said first transistor.

10. A fail-safe voltage-limiting circuit, as set forth in claim 9, wherein said predetermined second resistive ratio is essentially the resistive value of said second fail-safe resistor divided by the sum of resistive values of said second fail-safe resistor and said fourth resistor.

11. A fail-safe voltage-limiting circuit, as set forth in claim 6, wherein such predetermined first and second limit values are equivalent and such input signal, as presented to said indicating means, is symmetric about an average battery voltage level.

12. A fail-safe voltage-limiting circuit, as set forth in claim 11, wherein the peak-to-peak sum of such predetermined first and second limit values is less than ten percent of such preselected battery voltage level.

13. A fail-safe voltage-limiting circuit, as set forth in claim 6, wherein said indicating means includes a demodulator, driver circuit and a fail-safe relay which is energized when such amplitude-limited input signal is present at said second emitter terminal, said fail-safe relay, when energized, indicating an unoccupied track; and, when deenergized by the absence of such amplitude-limited input signal, indicating an occupied track.

14. A fail-safe voltage-limiting circuit, as set forth in claim 6, further comprising a first potentiometer connected in series to said second resistor such that such first predetermined resistive ratio can be adjusted thereby, and a second potentiometer connected in series to said fourth resistor such that said second predetermined resistive ratio can be adjusted thereby.

15. A method for limiting the peak-to-peak voltage levels of an EMI susceptible amplitude-modulated audio frequency input signal used to control a railway track circuit operating at a preselected battery voltage level, said voltage-limiting method comprising:

(a) imposing an audio frequency signal of varying amplitude at one end of a track section to be controlled;

(b) receiving such audio frequency signal at the opposite end of the track section to be controlled;

(c) filtering such audio frequency signal such that only a preselected frequency signal is passed to a demodulator circuit;

(d) demodulating such audio frequency signal in the demodulator circuit such that an amplitude-modulated signal having an EMI portion is produced;

(e) coupling such amplitude-modulated signal to a voltage-limiting circuit that includes a darlington pair transistor arrangement;

(f) limiting such amplitude-modulated signal to a predetermined first limit value during an increasing amplitude excursion of such amplitude-modulated signal as a function of a predetermined first resistive ratio associated with the darlington pair transistor arrangement;

(g) coupling such limited amplitude-modulated signal to an occupancy-indicating track circuit relay such that, the presence of such limited amplitude-modulated signal energizes the track circuit relay indicating the absence of a train in the track section to be controlled; and (h) interrupting the connection of such preselected battery voltage level to the darlington pair transistor arrangement in the event of a failure of the darlington pair transistor arrangement and a plurality of resistors associated with the darlington pair transistor arrangement.

16. A voltage-limiting method, as set forth in claim 15, further comprising limiting such amplitude-modulated signal to a predetermined second limit value during a decreasing excursion of such amplitude-modulated signal as a function of a predetermined second resistive ratio associated with the darlington pair transistor arrangement.

* * * * *